United States Patent [19]
Holdermann

[11] Patent Number: 5,882,435
[45] Date of Patent: Mar. 16, 1999

[54] PROCESS FOR THE METAL COATING OF SOLAR CELLS MADE OF CRYSTALLINE SILICON

[75] Inventor: Konstantin Holdermann, Offingen, Germany

[73] Assignee: Siemens Solar GmbH, Munich, Germany

[21] Appl. No.: 888,463

[22] Filed: Jul. 7, 1997

Related U.S. Application Data

[63] Continuation of Ser. No. 624,402, filed as PCT/DE94/01106, Sep. 22, 1994, abandoned.

[30] Foreign Application Priority Data

Sep. 30, 1993 [DE] Germany ............ 43 33 426.1

[51] Int. Cl.$^6$ .......................... H01L 31/00; B05D 3/00; B05D 5/12; C23C 16/48
[52] U.S. Cl. .......... 136/261; 136/254; 136/256; 136/265; 427/581; 427/584; 427/553; 427/555; 427/75; 427/98; 216/65; 216/94
[58] Field of Search ............ 427/74, 75, 98, 427/581, 584, 553, 555, 29, 226, 228; 216/65, 94; 438/762, 766, 759; 136/252, 254, 258, 261, 265, 256

[56] References Cited

U.S. PATENT DOCUMENTS

| | | | |
|---|---|---|---|
| 2,723,919 | 11/1955 | Pohnan ........................... | 427/581 |
| 4,024,029 | 5/1977 | Rain et al. ....................... | 204/15 |
| 4,144,139 | 3/1979 | Durkee . | |
| 4,256,513 | 3/1981 | Voshida et al. ................. | 437/2 |
| 4,349,583 | 9/1982 | Kulynych et al. .............. | 427/581 |
| 4,475,682 | 10/1984 | Coyl et al. ...................... | 228/123 |
| 4,766,009 | 8/1988 | Imura et al. .................... | 427/581 |
| 5,064,083 | 11/1991 | Eisch et al. .................... | 427/581 |
| 5,118,362 | 6/1992 | St. Angelo ...................... | 437/2 |
| 5,279,682 | 1/1994 | Wald et al. ..................... | 437/2 |
| 5,424,252 | 6/1995 | Morishita ....................... | 427/581 |

FOREIGN PATENT DOCUMENTS

| | | |
|---|---|---|
| 0 542 148 A1 | 5/1993 | European Pat. Off. . |
| 23 48 182 | 10/1975 | Germany . |
| 30 06 716 | 11/1980 | Germany . |
| 2 188 774 | 7/1987 | United Kingdom . |

OTHER PUBLICATIONS

Abstract of Japan –JP3263877 Nov. 1991 to Minamori Takayuki et al.
Abstract of Japan –JP3250671 Nov. 1991 to Tanaka Satoshi.
21st IEEE Photovoltaic Specialists Conference, May 21–25, 1990, "Cast Polycrystalline Silicon Cell with Grooved Surface", T. Nunoi et al. pp. 664–665.
Translation made Jan. 1997 of EP 542,148 A1 to Holdermann (May 19, 1993).
Translation made Jan. 1997 of German P.N. 2,348,182 to Späth et al. (Apr. 10, 1975).

*Primary Examiner*—Marianne Padgett
*Attorney, Agent, or Firm*—Hill & Simpson

[57] ABSTRACT

Solar cells made of crystalline are metal coated. Combined front side and rear side metal coating based on a thick-film process is proposed, in which even very fine thick-film conductor track structures are sufficiently reinforced by photo-induced currentless deposition of a metal. Well adhering improved conductor track structures for the front side metal coating can be produced using the simplified process.

8 Claims, 3 Drawing Sheets

PROCESS FOR THE METAL COATING OF SOLAR CELLS MADE OF CRYSTALLINE SILICON

This is a continuation of application Ser. No. 08/624,402 filed Mar. 29, 1996 now abandon, which is a 371 continuation of PCT/DE94/01106 filed Sep. 22, 1994.

BACKGROUND OF THE INVENTION

The metal coating of solar cells is understood to mean the production or application of current-discharging, electrically conductive contacts on or to the front and rear sides of solar cells. The metal coating must, therefore, be able to establish a good resistive contact with the semiconductor in order to ensure that the charge carriers emerge from the semiconductor into the current-discharging contacts without any disturbances. In order to avoid current losses, the metal coating must additionally have an adequate current conductivity, that is to say either a high conductivity and/or a sufficiently high conductor track cross section.

A multiplicity of processes which meet these requirements exist for the metal coating of rear sides of solar cells. The aim when metal coating the front side, or light incidence side, of the solar cell is to achieve the least possible shading of the active semiconductor surface, in order to use as much of the surface as possible for capturing photons. However, this can be achieved only with a smaller conductor track cross section, which conflicts with the requirements of high current conductivity. With fine conductor track structures, moreover, the metal coating may manifest adhesion problems, in particular on crystalline silicon.

Metal coating using a thick-film technique is an economical and conventional technique. The pastes used comprise metal particles (predominantly silver) and are electrically conductive as a result. They can be applied by screen, mask and pad printing or by paste writing. A widely used process at the present time is the screen printing process, by means of which finger-shaped metal coating lines having a width of up to approximately 80–100 $\mu$m are possible for the metal coating. Even at this grid width, electrical conductivity losses are evident in comparison with a pure metal structure, and this can have an adverse effect on the series resistance and thus on the filling factor and the efficiency. At even smaller printed-on conductor track widths, this effect is intensified since the process causes the conductor tracks simultaneously to become flatter as well. The nonconductive oxide and/or glass components between the metal particles constitute a fundamental cause of this reduced conductivity. On the other hand, the glass component is necessary for the adhesion of the conductor tracks on the solar cell.

More complex processes for producing the front side contacts make use of a laser or photographic technique for the definition of the conductor track structures. Various metal coating steps are often necessary in order to apply the metal coating with adhesive strength and to the thickness required for the electrical conductivity. It is thus proposed in German references DE 43 11 173 A1, which is not a prior publication that is, it is not prior art to the present application, that with wet-chemical metal coating, a first, fine metal coating takes place by means of palladium nuclei and is reinforced with adhesive strength by means of currentless deposition of nickel. In order to increase the conductivity further, copper is deposited currentlessly or electrolytically over this, said copper, in turn, expediently being protected against oxidation by means of a fine silver or tin layer.

The disadvantage of these processes, which often require a plurality of metal coating baths and therefore also have a high outlay as far as disposal is concerned, is, moreover, that they have a damaging effect to a greater or lesser extent on a rear side metal coating (which is printed on, for example) and therefore the latter is often specially protected.

European references EP-A 0 542 148 discloses a process for the production of an electrode structure for the front side metal coating of a solar cell. In this case, an electrode structure is initially produced on the solar cell body using a thick-film technique and is subsequently reinforced by the electrodeposition of silver or copper.

U.S. Pat. No. 4,144,139 discloses a process for the production of a front side contact for solar cells in which a metallic base is thickened by means of currentless, light-assisted metal deposition from the solution.

SUMMARY OF THE INVENTION

The object of the present invention is to specify a different process for the metal coating of solar cells which is simple to carry out, does not require electrodeposition of metal and therefore electrical contact-making, and in which the processes for front side and rear side metal coating are compatible. The process is to produce conductor track widths of less than 100 $\mu$m and sufficiently electrically conductive contacts which adhere well to silicon.

In general terms the present invention is a first embodiment in a process for metal coating of solar cells made of crystalline silicon. The first embodiment has the stepts of:

a) providing a solar cell body made of crystalline silicon having a flat n-doped region in a vicinity of a front side of the solar cell body;

b) producing a dielectric on the front side;

c) producing rear side metal coating by applying and firing a conductive paste, which has an organic binder, a glass matrix and electrically conductive particles;

d) applying a bus structure as a front side metal coating using a thick-film technique, the bus structure being a thick-film structure; and e) photo-induced currentless depositing a metal, selected from silver or copper, on the front side over the thick-film structure while using a fired conductive paste on the rear side as a sacrificial anode.

In a second embodiment the present invention is also a process for metal coating of solar cells made of crystalline silicon. This second embodiment has the steps of:

a) providing a solar cell body made of crystalline silicon having a flat n-doped region in a vicinity of a front side of the solar cell body;

b) producing a dielectric on the front side;

b1) producing a trench pattern in the dielectric down into the solar cell body for definition of fine structures for front side metal coating;

c) producing a rear side metal coating by applying and firing a conductive paste, which has an organic binder, a glass matrix and electrically conductive particles;

d) applying a bus structure for the front side metal coating using a thick-film technique, the bus structure being a thick-film structure;

e) photo-induced currentless depositing a metal, selected from silver or copper, on the front side over the thick-film structure and on the semiconductor surface exposed in the trenches of the trench pattern, while using a fired conductive paste on the rear side as a sacrificial anode.

Advantageous developments of the present invention are as follows. In process step d) a printable, electrically conductive paste is used and is fired jointly with the rear side metal coating.

Silver is deposited from a bath containing cyanide ions during the photo-induced metal deposition in process step e.

The metal deposition in process step e is induced and assisted by infrared radiation.

For wider bus structures of the front side metal coating, a plurality of parallel, closely adjacent narrower lines are printed onto the front side using an electrically conductive paste and are reinforced by the metal deposition such that the narrower lines knit together to form the wider bus structure.

For the process of the second embodiment and prior to process step d), in the trenches in the silicon of the solar cell body, the exposed silicon is heavily doped by diffusing an n-type dopant into the trenches and the bus structure is produced transversely over the trenches using a thick-film technique according to process step d). The trenches for the fine structures of the front side metal coating are produced by one of laser irradiation, a photographic technique and etching step, sawing or scratching, and wherein the silicon surface exposed in the trenches is subsequently roughened by texture etching. The thick-film metal coating of the bus structure is produced before or after the metal deposition in the trenches by applying conductive adhesive or conductive lacquer.

The front side metal coating includes bus structures and fine structures. The bus structures and fine structures are produced by printing on a conductive paste.

The process according to the invention uses a thick-film process, in particular a printing process using a conductive paste, for the production both of the rear side contact and of the front side contact. Identical or similar metal coating processes can be used to carry out double-sided metal coating in a known manner in one joint step or in steps which succeed one another with short time intervals. The process can be used to produce on the front sides of solar cells metal coatings whose conductor track widths are significantly less than 100 $\mu$m and which nevertheless have sufficient conductivity. The disadvantage of low conductivity in known thick-film structures is compensated for by means of the additional photo-induced deposition of an electrically readily conductive metal over the thick-film metal coating. By growing on the additional metal layer, even nonconductive interruptions in the printed-on thick-film structure can be partially "repaired". The growing metal knits together over such nonconductive regions and bridges them in a conductive manner. The process therefore unites the advantages of metal coating using a readily conductive metal (good current conduction in conjunction with a small conductor track cross section) with good adhesion and simple application of the thick-film metal coating, without having to accept the disadvantages thereof. The structuring of the front side metal coating, which can be implemented, for example, in the form of finger-shaped contacts, is possible in a simple manner using the thick-film technique. The structure is already defined by the application process for the conductive paste. Suitable processes are, for example, screen, mask and pad printing or paste writing and similar processes.

The metal deposition takes place in a photo-induced and currentless manner. The charge carriers (electrons) which are required for the reduction of the metal ion from the solution are produced as charge carrier pairs in a light-induced manner in the semiconductor, are separated from the holes at the pn junction and transported to the semiconductor surface. The metal deposition takes place specifically on the thick-film metal coating, which is in good resistive contact with the semiconductor and has a higher conductivity than the semiconductor. Metal coating baths which are known from electrodeposition can be used for the metal deposition. Metal coating baths which are already used for the chemical deposition of metals are also suitable. In this case, the metal deposition is accelerated by the photographic assistance and/or is made possible at lower temperatures. This is particularly advantageous with chemically aggressive metal coating baths, which may interact unfavorably with the thick-film metal coating. For example, the conductive paste comprising the oxide constituents can be attacked in an acidic and in a basic environment, whereupon detachment of the conductor track or interruption of the current conduction may occur.

The photo-induced, currentless metal deposition requires the irradiation of the semiconductor with electromagnetic radiation in the absorption range of the semiconductor. Visible light or near IR is chosen, therefore, for silicon. The second of these choices makes use of the red sensitivity of silicon and results in the production of charge carrier pairs at a point which is situated more deeply within the semiconductor.

What is critical for the rate of deposition is the availability of the electrons from the rear side metal coating for the purpose of charge equalization. This metal coating serves, as it were, as a sacrificial anode during the process, since metal is oxidized here and dissolves. It is therefore advantageous to apply the rear side metal coating in redundant excess, so that it still completely fulfills its later function as rear side contact.

It is sufficient, for example, to illuminate the solar cell, which is arranged in a metal coating bath, from the front side at a distance of approximately 30 cm using a 75 watt incandescent bulb (tungsten filament) or a 150 watt IR lamp.

For the rear side and front side metal coating, it is possible, as mentioned, to use electrically conductive pastes, which can be fired jointly in one step ("cofiring"). For the front side metal coating, it is also possible to apply a conductive adhesive or conductive lacquer using a thick-film technique. This also comprises metallic particles, in particular silver, which provide for the conductivity. The particles are embedded in an organic matrix, which ensures the processibility and adhesion of the adhesive on the substrate. Here, too, very fine conductive adhesive structures can be reinforced by the photo-induced (currentless) metal deposition.

In a further refinement of the invention, not only the thick-film technique but also a further, so-called trench technique is used for the definition of the front side metal coating. For this purpose, fine trenches reaching down into the semiconductor are produced in the front side of the solar cell, which is provided with a layer of a dielectric. The conductive paste is then applied and, if appropriate, fired transversely over these trenches. It is sufficient here if the paste bridges the trenches. During the application of the paste transversely with respect to the trenches, the walls of said trenches also make contact with the paste to a greater or lesser extent. However, it is not absolutely necessary that the bridged trenches be completely filled or that the paste make contact with the bottom of the trenches.

In the subsequent currentless, photo-induced metal deposition process, the metal is deposited not only over the thick-film structure, but also directly on the semiconductor surface exposed in the trenches. It is advantageous here if the semiconductor in the trenches is heavily n-doped. During the deposition, the metal layer deposited in the trenches knits together with the thick-film structure or the metal layer deposited over the thick-film structure and thus forms an electrically readily conductive connection.

It is possible to produce extremely fine, current-discharging contacts for the front side metal coating by means of this process variant. The somewhat wider thick-film structures serve as current busbars or so-called bus structures. On the well adhering bus structures, in turn, electrical conductors can now be connected in a simple manner to the solar cell, for example by soldering on ribbons in the case of thick buses or wires in the case of narrow buses. The silver which is preferably used for the photo-induced metal deposition exhibits inadequate adhesion on a planar and even on a textured silicon surface. On the other hand, if the silver is deposited in trenches instead of on a planar surface, the adhesion is significantly improved. Any possible tensile loading due to the soldered-on electrical conductors or any other mechanical stress acts only on the well adhering thick-film structures. The trenches for the fine structures of the front side metal coating can be produced by laser irradiation. It is also possible to produce the fine structures in a photoresist by means of a photographic technique and to etch the trenches through the photoresist mask. It is also possible to produce the trenches mechanically, by sawing, scratching or the like.

Further improved adhesion of the metal structures in the trenches is achieved if the inner walls of the trenches are roughened prior to the metal deposition by means of texture etching. This results in good intermeshing between the subsequently deposited metal structures and the roughened silicon. Particularly good intermeshing is achieved here in trenches in polycrystalline silicon. In this case, the texture which can be obtained is advantageously very irregularly oriented due to the varying crystal orientations.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

DESCRIPTION OF THE PREFERRED EMBODIMENTS

Figure 1:
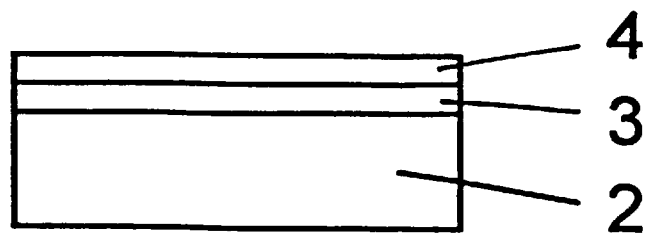
FIGS. 1, 2 and 3 show a diagrammatic cross section through a solar cell during different process stages of a first exemplary embodiment.

FIG. 1: A wafer of crystalline or polycrystalline silicon having a p-type base doping is used as the solar cell body. The front side can be subjected to crystal-oriented texture etching in order to impart to the surface an improved light incidence geometry which reduces reflections (not illustrated in FIG. 1). In order to produce the semiconductor junction, phosphorus diffusion now takes place on the front side of the solar cell body 1, a flat, n-doped layer region 3 being produced.

In order further to improve the optical and electrical properties of the solar cell body, a dielectric layer 4 is produced on the front side. This simultaneously serves as a passivation layer and an antireflection layer. It can be an oxide layer $SiO_x$, a nitride layer $Si_3N_4$, a combination of the two or a combination with a titanium oxide layer $TiO_x$.

First Exemplary Embodiment

Application of the rear side metal coating:

The rear side metal coating is applied in the form of an electrically conductive paste by means of one of the said paste printing or writing processes. In addition to a combustible organic binder, the paste comprises a glass matrix in which electrically conductive particles are embedded. The silver-containing paste in the example can also comprise aluminum which, during firing of the paste, alloys or partially diffuses into the rear side, improves the resistive contact in the process and produces p+-doped regions there. It is also possible to produce a heavily doped p+-type region, a so-called "back surface field", by previous application of Al or B with subsequent indiffusion.

Furthermore, an aluminum-containing paste can be applied and fired prior to the application of the rear side metal coating. If appropriate, the residue of the aluminum-containing paste is removed again from the rear side of the solar cell body after firing. The rear side metal coating can be applied over the whole area or in the form of an arbitrary coarse grid.

Application of the front side metal coating:

The same conductive paste as used for the rear side is used for the front side metal coating 6, but without Al. Using a suitable application process, structured front side contacts are applied which, depending on the number, can consist of current busbars (bus structures) having a greater or lesser thickness and fine-structure contacts which are applied transversely with respect to said busbars.

Figure 2:
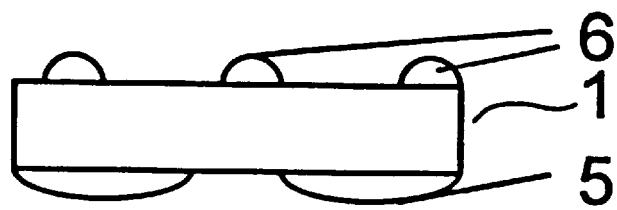

Firing of the printed-on metal coating (FIG. 2):

In a furnace process, the printed-on rear side contacts 5 and the front side contacts 6 are now fired jointly. The required temperatures depend on the paste composition and the thickness of the dielectric layer, but can otherwise be selected freely. Depending on the paste composition, the firing can take place in an oxidative atmosphere or under inert gas with little oxygen. A two-stage firing process is also possible, with preliminary firing under little oxygen at up to approximately 400° C. and subsequent firing at a higher temperature under inert gas or a reducing atmosphere.

After the firing process, there takes place in the trench technique a short treatment in dilute, optionally buffered, HF solution in order to remove any oxide that has been produced. Since a native oxide grows on silicon even when it stands in air, which oxide disturbs the metal deposition, this so-called HF dip should fundamentally take place independently of the firing conditions in the trench technique (arrangement of the metal coating in trenches).

It is possible to dispense with an HF dip in the planar technique, in which only the printed-on structures of the front side are reinforced in a photo-induced manner. The cyanide-containing silver solution, however, permits a greater leeway here in the setting of the firing conditions, and the n-doping can be chosen to be weaker, which leads to lower recombination losses. The electrical parameters can be additionally improved by brief, photo-induced silver deposition from cyanide-containing solution, similarly to the improvement resulting from the HF dip. A clear increase in stability is evident here in the humidity test, even after a preceding HF dip. Without exposure in the silver cyanide bath, passivated solar cells having printed-on front side contacts exhibit a clear instability in the humidity test after acid treatment. Consequently, practicality is imparted to the trench technique for the first time by the process according to the invention.

Photo-induced metal deposition (FIG. 3):

One of the electrically readily conductive metals copper or silver is chosen to reinforce the printed-on front side contacts. Silver is preferred, however, and is already contained in the printed-on paste of the front side and rear side contacts 5 and 6. This has the advantage that apart from aluminum, which may also be replaced by boron, only a single metal has to be used for the metal coating of the solar cell. The use of only one metal salt bath simplifies the outlay on disposal in the manufacturing process. Dispensing with different metals facilitates the optionally required, subsequent disposal or the recycling of solar cells which are no longer functional.

Cyanide-containing silver baths which are usual in electrodeposition and can comprise, per liter, from 20 to 100 g of silver and from 120 to 1 g of potassium cyanide as electrolyte are suitable for the photo-induced silver deposition. The solutions here are strongly to weakly basic. Good silver deposition can also be obtained, in a photo-induced manner, from non-cyanide-containing silver solutions, i.e., for example, from a bath comprising dissolved sodium thiosulfate and silver chloride. However, the bath stability under illumination is inadequate.

For the purpose of metal or silver deposition, the solar cell bodies are immersed in the metal coating bath and illuminated. A normal incandescent lamp of, for example, 75 watts or an infrared lamp can be used as the light source. In this case, the solar cell bodies can be placed one behind the other into appropriate racks and illuminated obliquely at the side. In this way, metal can be deposited simultaneously on a multiplicity of solar cell bodies during irradiation when working with racks and using a single lamp.

It is also possible to carry out the photo-induced metal deposition continuously, the solar cell bodies being placed onto appropriate belts or frames in so that they lie one behind the other or above one another and next to one another and are moved through the bath continuously while being irradiated. Depending on the device used, the solar cell bodies can rest horizontally or inclined on a carrier.

Suitable devices for carrying out the metal deposition with continuous operation are known for electrodeposition installations. It is possible, for example, to introduce solar cell bodies which are mounted appropriately on a belt or a frame into a metal coating bath below the surface of the liquid, the overflowing bath being caught and pumped back into the vessel of the metal coating bath.

The metal deposition rate depends on the chosen illumination power, the distance between the radiation source and the surface to be metal coated, the temperature of the metal coating bath and, last but not least, the type of rear side metal coating. The type of rear side metal coating governs how easily its metal components are oxidized and dissolved, so that electrons are available for the charge equalization and hence for the metal reduction on the front side. During the light-induced metal deposition, it is possible to deposit on the n-doped surface only the same amount of metal that is redissolved at the opposite, p-doped side.

The process extends the use of photo-induced metal deposition from front side and rear side contacts comprising pure metal to include printed-on and fired contacts. Despite the surrounding sintered oxide and glass components, electrons are made sufficiently available for charge equalization by means of the paste of the rear side contact, even after a firing process under oxygen.

It is also not necessary that the metal which dissolves on the rear side be more electronegative than the metal to be deposited on the front side.

The metal deposition takes place exclusively on the printed-on front side metal coating 6. Depending on the specified parameters and, in addition, on the width of the printed-on metal coating tracks 6, a metal layer 7 is deposited after a time of 5 seconds to 3 minutes with such a thickness that the front side contacts thereby acquire a conductivity which is sufficient for current discharge.

Figure 3:
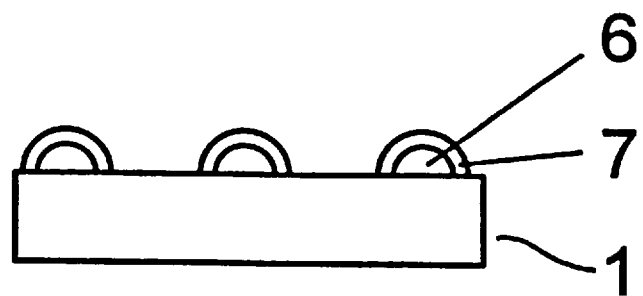
Figure 4:
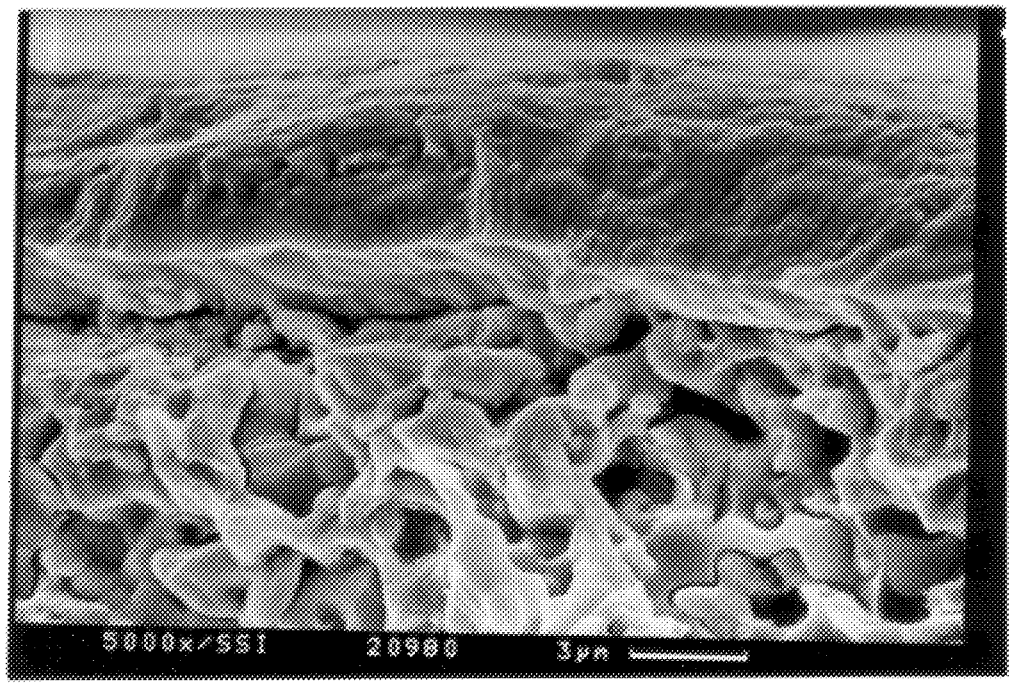
FIG. 4 shows an SEM (scanning electron microscope) recording of a reinforced metal coating.

FIG. 3 shows a diagrammatic cross section of such a thick-film metal coating which has been reinforced currentlessly, while FIG. 4 shows a cross section in the form of an SEM recording. The relatively coarse structure of the thick-film metal coating 6, which can easily lead to an interruption in the current path given correspondingly fine and narrow conductor tracks, can readily be seen. The continuous, smooth silver layer 7 deposited above this can now electrically conductively interconnect metal particles in the thick-film metal coating which had previously been separated from one another.

Second Exemplary Embodiment

Production of trenches on the front side of the solar cell.

Figure 5:
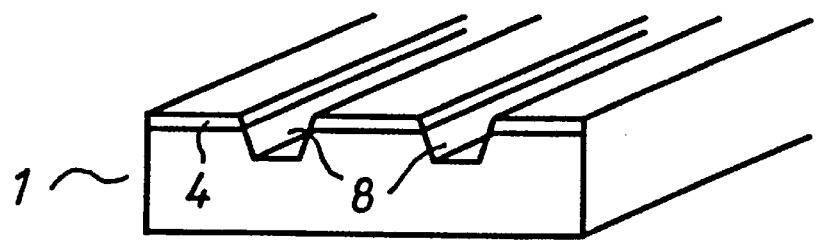
FIGS. 5, 6 and 7 show a perspective elevation of the solar cell during different process stages of the second exemplary embodiment.

FIG. 5: The solar cell body 1, which is prepared as in the first exemplary embodiment and is provided with a layer of a dielectric, is first of all covered on its front side with a trench pattern, which defines the fine structures for the front side metal coating. The trenches 8 can be defined and produced by means of photolithography and subsequent etching or can be formed directly with a laser or mechanically with the aid of a tool of appropriate hardness, by sawing, scratching or the like. The trenches 8 reach through the dielectric 4 into the semiconductor of the solar cell body 1 to a depth of approximately 2–20 $\mu$m. If appropriate, this may be followed by acid aftertreatment or alkali texture etching in order to roughen the trench surfaces. FIG. 5 shows the arrangement following creation of the trenches 8.

Figure 6:
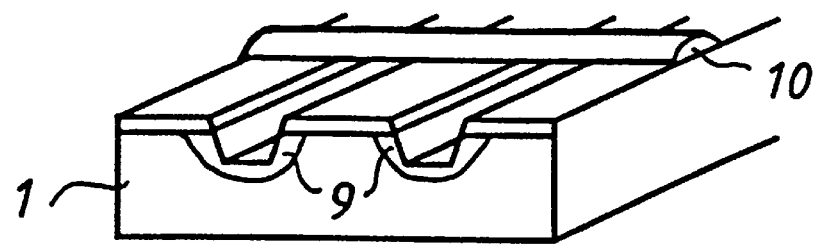

FIG. 6: In order to make better resistive contact with the metal layer which is subsequently to be deposited in the trenches 8, a second diffusion process is carried out using an n-type dopant, resulting in n++-doping 9 in the region of the trenches.

Following the second diffusion process, the rear side metal coating is produced as specified in the first exemplary embodiment. For the front side metal coating, too, as in the first exemplary embodiment, an electrically conductive paste 10 is applied in fine tracks transversely over and beyond the trenches 8. The front side and rear side metal coating are again fired jointly in a single step.

Figure 7:
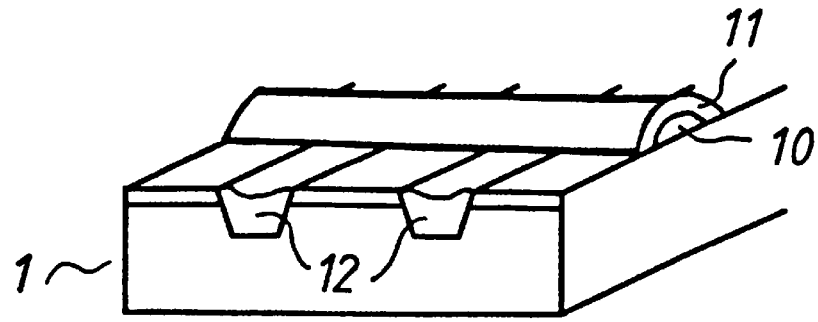

Photo-induced metal deposition:

FIG. 7: The solar cell body 1 prepared in this way and illustrated diagrammatically in FIG. 6 as an extract is now metal coated in a photo-induced manner, the procedure being the same as in the first exemplary embodiment. However, the metal deposition now takes place not only over the printed-on front side metal coatings 10, but also directly on the heavily doped semiconductor surface exposed in the trenches 8. As a result of the partial growing-over of the trenches by the deposited metal layer 12 and the thickening of the thick-film structures 10 by the growing metal layer 11, the thick-film structure is electrically conductively connected to the metal layer 12 growing in the trenches.

Third Exemplary Embodiment

A solar cell body is prepared as in the second exemplary embodiment and provided with a trench structure on the front side. After a thick-film structure for the rear side metal coating has been produced and fired, a first front side metal coating is applied in the form of fine conductor tracks made of conductive adhesive or conductive lacquer. In contrast to the conductive paste comprising oxide particles, however, the conductive lacquer is not fired, since the organic matrix is required for the adhesion of the conductive lacquer on the solar cell body or over the layer of dielectric 4.

In the subsequent metal coating step, which is to be carried out in an analogous manner, silver is deposited in the trenches 8 and at the same time the conductive lacquer or conductive adhesive structures on the front side are provided with a silver coating.

In a variation of this exemplary embodiment, it is also possible, following the photo-induced currentless metal deposition in the trenches 8, to apply the conductive lacquer or conductive adhesive structures transversely with respect to said trenches on the front side.

Since for each solar cell one or two wider conductor tracks are sufficient as bus structures, they can also be embodied with a corresponding thickness without there being any appreciable increase in the shading of the photovoltaically active semiconductor surface. It is of prime importance, however, that the inventive process according to one of the three exemplary embodiments can be used to produce very fine conductor track structures for the front side metal coating which result in significantly reduced shading of the solar cell surface in comparison with known printed-on conductor tracks. The process according to the invention is clearly simplified in comparison with the known processes which result in similarly fine conductor track structures with the aid of multilayer metal coating.

The process conditions when firing the conductive paste can become less stringent. Thus, the electrical parameters of the solar cell can be improved by means of the already mentioned acid aftertreatment of the fired thick-film metal coatings without thereby increasing the sensitivity of the finished solar cell to humidity, said sensitivity having previously been observed following acid treatment in the case of weakly doped solar cell front sides having a dielectric. Solar cells produced in this way thus have an increased stability under humidity in comparison with known processes. This is attributed to an effect brought about by the cyanide-containing metal coating bath. The same effect also brings about a distinct improvement in the electrical parameters of the later solar cells.

Furthermore, a distinct improvement in the solderability of the printed-on contacts is obtained. On the front side, this takes place, understandably, by means of the deposited silver. However, the printed-on rear side contacts, too, can be better soldered after the cyanide-containing silver bath.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for metal coating of solar cells made of crystalline silicon, comprising steps of:
   a) providing a solar cell body made of crystalline silicon having a flat n-doped region in a region on a front side of the solar cell body;
   b) producing a dielectric on the front side;
   b1) producing a trench pattern having trenches in the dielectric down into the solar cell body thereby forming exposed silicon and structures for front side metal coating;
   c) producing a rear side metal coating by applying and firing a conductive paste, which has an organic binder, a glass matrix and electrically conductive particles;
   d1) doping, in the trenches the exposed silicon of the solar cell body, by diffusing an n-type dopant into the trenches;
   d2) producing a bus structure above above the trenches using a thick-film technique, the bus structure being a thick-film structure;
   e) causing photo-induced deposition of a metal where no current is applied, where said metal is selected from silver or copper, on the front side over the thick-film structure and on the exposed silicon in the trenches of the trench pattern, while using the fired conductive paste on the rear side as a sacrificial anode.

2. The process as claimed in claim 1, wherein the trenches for the structures of the front side metal coating are produced by one of laser irradiation, a photographic technique and etching step, sawing or scratching, and wherein the silicon surface exposed in the trenches is subsequently texture etched.

3. The process as claimed in claim 1, wherein the thick-film structure of the bus structure is produced before the metal deposition in the trenches by applying conductive adhesive or conductive lacquer.

4. The process as claimed in claim 1, wherein in process step d2 the conductive paste is used and is fired jointly with the rear side metal coating.

5. The process as claimed in claim 1, wherein silver is deposited from a bath containing cyanide ions during the photo-induced metal deposition in process step e.

6. The process as claimed in claim 1, wherein the metal deposition in process step e is induced and assisted by infrared radiation.

7. The process as claimed in claim 1, wherein for producing the bus structures, a plurality of parallel, adjacent lines are printed onto the front side using an electrically conductive paste and are reinforced by the metal deposition such that the lines knit together to form the bus structure into a single structure.

8. The process as claimed in claim 1, wherein, in regards to step d2), the front side metal coating includes bus structures and further structures, and wherein, in regards to step d2), the bus structures and the further structures are produced by printing on a conductive paste.

* * * * *